United States Patent
Fujiwara et al.

(10) Patent No.: US 8,178,919 B2
(45) Date of Patent: May 15, 2012

(54) NONVOLATILE SEMICONDUCTOR MEMORY DEVICE AND METHOD FOR MANUFACTURING SAME

(75) Inventors: Tomoko Fujiwara, Kanagawa-ken (JP); Ryota Katsumata, Kanagawa-ken (JP); Masaru Kito, Kanagawa-ken (JP); Yoshiaki Fukuzumi, Kanagawa-ken (JP); Masaru Kidoh, Tokyo (JP); Hiroyasu Tanaka, Kanagawa-ken (JP); Yosuke Komori, Mie-ken (JP); Megumi Ishiduki, Kanagawa-ken (JP); Junya Matsunami, Kanagawa-ken (JP); Hideaki Aochi, Kanagawa-ken (JP); Ryouhei Kirisawa, Kanagawa-ken (JP); Yoshimasa Mikajiri, Kanagawa-ken (JP); Shigeto Oota, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 12/727,830

(22) Filed: Mar. 19, 2010

(65) Prior Publication Data

US 2011/0018050 A1 Jan. 27, 2011

(30) Foreign Application Priority Data

Jul. 21, 2009 (JP) ................................ 2009-169954

(51) Int. Cl.
*H01L 21/00* (2006.01)
(52) U.S. Cl. ..................... 257/324; 257/319; 365/185.18
(58) Field of Classification Search .................. 257/324, 257/319; 365/185.18
See application file for complete search history.

(56) References Cited

U.S. PATENT DOCUMENTS

| | | | | |
|---|---|---|---|---|
| 7,859,066 B2* | 12/2010 | Kito et al. | ..................... | 257/411 |
| 7,927,953 B2* | 4/2011 | Ozawa | .......................... | 438/287 |
| 7,927,967 B2* | 4/2011 | Nomura et al. | ............... | 438/430 |
| 7,936,004 B2* | 5/2011 | Kito et al. | ..................... | 257/324 |
| 7,969,789 B2* | 6/2011 | Katsumata et al. | ...... | 365/185.28 |
| 8,008,710 B2* | 8/2011 | Fukuzumi et al. | ............ | 257/326 |
| 2007/0252201 A1* | 11/2007 | Kito et al. | ..................... | 257/331 |
| 2008/0067583 A1* | 3/2008 | Kidoh et al. | .................. | 257/326 |

(Continued)

FOREIGN PATENT DOCUMENTS

JP 2007-266143 10/2007

(Continued)

OTHER PUBLICATIONS

U.S. Appl. No. 12/886,132, filed Sep. 20, 2010, Yahashi, et al.

(Continued)

*Primary Examiner* — Laura Menz
(74) *Attorney, Agent, or Firm* — Oblon, Spivak, McClelland, Maier & Neustadt, L.L.P.

(57) ABSTRACT

A nonvolatile semiconductor memory device, includes: a stacked structural unit including electrode films alternately stacked with inter-electrode insulating films; first and second semiconductor pillars piercing the stacked structural unit; a connection portion semiconductor layer electrically connect the first and second semiconductor pillars; a connection portion conductive layer provided to oppose the connection portion semiconductor layer; a memory layer and an inner insulating film provided between the first and semiconductor pillars and each of the electrode films, and between the connection portion conductive layer and the connection portion semiconductor layer; an outer insulating film provided between the memory layer and each of the electrode films; and a connection portion outer insulating film provided between the memory layer and the connection portion conductive layer. The connection portion outer insulating film has a film thickness thicker than a film thickness of the outer insulating film.

15 Claims, 10 Drawing Sheets

U.S. PATENT DOCUMENTS

| | | | |
|---|---|---|---|
| 2008/0079046 A1* | 4/2008 | Ozaki | 257/295 |
| 2009/0321813 A1* | 12/2009 | Kidoh et al. | 257/324 |
| 2010/0013049 A1* | 1/2010 | Tanaka et al. | 257/532 |
| 2010/0034028 A1* | 2/2010 | Katsumata et al. | 365/185.28 |
| 2010/0038699 A1* | 2/2010 | Katsumata et al. | 257/324 |
| 2010/0038703 A1* | 2/2010 | Fukuzumi et al. | 257/326 |
| 2010/0044776 A1* | 2/2010 | Ishiduki et al. | 257/324 |
| 2010/0072538 A1* | 3/2010 | Kito et al. | 257/326 |
| 2010/0109071 A1* | 5/2010 | Tanaka et al. | 257/324 |
| 2010/0109072 A1* | 5/2010 | Kidoh et al. | 257/324 |
| 2010/0117137 A1* | 5/2010 | Fukuzumi et al. | 257/324 |
| 2010/0118610 A1* | 5/2010 | Katsumata et al. | 365/185.18 |
| 2010/0140684 A1* | 6/2010 | Ozawa | 257/324 |
| 2010/0144133 A1* | 6/2010 | Nomura et al. | 438/586 |
| 2010/0181612 A1* | 7/2010 | Kito et al. | 257/319 |
| 2010/0200906 A1* | 8/2010 | Kidoh et al. | 257/324 |
| 2010/0207190 A1* | 8/2010 | Katsumata et al. | 257/319 |
| 2010/0207194 A1* | 8/2010 | Tanaka et al. | 257/324 |
| 2010/0213537 A1* | 8/2010 | Fukuzumi et al. | 257/326 |
| 2010/0213538 A1* | 8/2010 | Fukuzumi et al. | 257/326 |
| 2010/0224928 A1* | 9/2010 | Fukuzumi et al. | 257/324 |
| 2010/0244119 A1* | 9/2010 | Fukuzumi et al. | 257/324 |
| 2010/0244186 A1* | 9/2010 | Katsumata et al. | 257/530 |
| 2010/0244189 A1* | 9/2010 | Klootwijk et al. | 257/532 |
| 2010/0320526 A1* | 12/2010 | Kidoh et al. | 257/324 |
| 2010/0327339 A1* | 12/2010 | Tanaka et al. | 257/324 |
| 2010/0327340 A1* | 12/2010 | Oota et al. | 257/324 |
| 2011/0002172 A1* | 1/2011 | Kito et al. | 365/185.18 |
| 2011/0012188 A1* | 1/2011 | Kito et al. | 257/324 |
| 2011/0013454 A1* | 1/2011 | Hishida et al. | 365/185.11 |
| 2011/0018050 A1* | 1/2011 | Fujiwara et al. | 257/324 |
| 2011/0018052 A1* | 1/2011 | Fujiwara et al. | 257/324 |
| 2011/0019480 A1* | 1/2011 | Kito et al. | 365/185.18 |
| 2011/0031550 A1* | 2/2011 | Komori et al. | 257/324 |
| 2011/0032772 A1* | 2/2011 | Aritome | 365/185.29 |
| 2011/0049607 A1* | 3/2011 | Yahashi | 257/324 |
| 2011/0051527 A1* | 3/2011 | Kirisawa et al. | 365/185.29 |
| 2011/0057249 A1* | 3/2011 | Nakao et al. | 257/324 |
| 2011/0063914 A1* | 3/2011 | Mikajiri et al. | 365/185.15 |
| 2011/0103149 A1* | 5/2011 | Katsumata et al. | 365/185.18 |
| 2011/0103153 A1* | 5/2011 | Katsumata et al. | 365/185.23 |
| 2011/0127597 A1* | 6/2011 | Fukuzumi et al. | 257/314 |
| 2011/0147818 A1* | 6/2011 | Katsumata et al. | 257/314 |
| 2011/0147822 A1* | 6/2011 | Aoyama et al. | 257/319 |
| 2011/0156131 A1* | 6/2011 | Ozawa | 257/324 |
| 2011/0180866 A1* | 7/2011 | Matsuda et al. | 257/324 |
| 2011/0188307 A1* | 8/2011 | Kito et al. | 365/185.02 |
| 2011/0188321 A1* | 8/2011 | Kito et al. | 365/185.29 |
| 2011/0193153 A1* | 8/2011 | Higuchi et al. | 257/324 |
| 2011/0215394 A1* | 9/2011 | Komori et al. | 257/324 |
| 2011/0216604 A1* | 9/2011 | Mikajiri et al. | 365/185.26 |
| 2011/0227140 A1* | 9/2011 | Ishiduki et al. | 257/324 |
| 2011/0233644 A1* | 9/2011 | Fukuzumi et al. | 257/324 |
| 2011/0284947 A1* | 11/2011 | Kito et al. | 257/324 |
| 2011/0287597 A1* | 11/2011 | Kito et al. | 438/261 |
| 2011/0309431 A1* | 12/2011 | Kidoh et al. | 257/324 |
| 2011/0309432 A1* | 12/2011 | Ishihara et al. | 257/324 |
| 2011/0316069 A1* | 12/2011 | Tanaka et al. | 257/324 |
| 2012/0001249 A1* | 1/2012 | Alsmeier et al. | 257/319 |
| 2012/0001250 A1* | 1/2012 | Alsmeier | 257/319 |

FOREIGN PATENT DOCUMENTS

| | | |
|---|---|---|
| JP | 2009-146954 | 7/2009 |
| JP | 2010171185 A * | 8/2010 |
| JP | 2010182947 A * | 8/2010 |
| JP | 2010192569 A * | 9/2010 |
| JP | 2011029234 A * | 2/2011 |
| WO | WO 2009/075370 A1 | 6/2009 |
| WO | WO 2010004706 A1 * | 1/2010 |

OTHER PUBLICATIONS

U.S. Appl. No. 12/679,991, filed Mar. 25, 2010, Fukuzumi, et al.

* cited by examiner

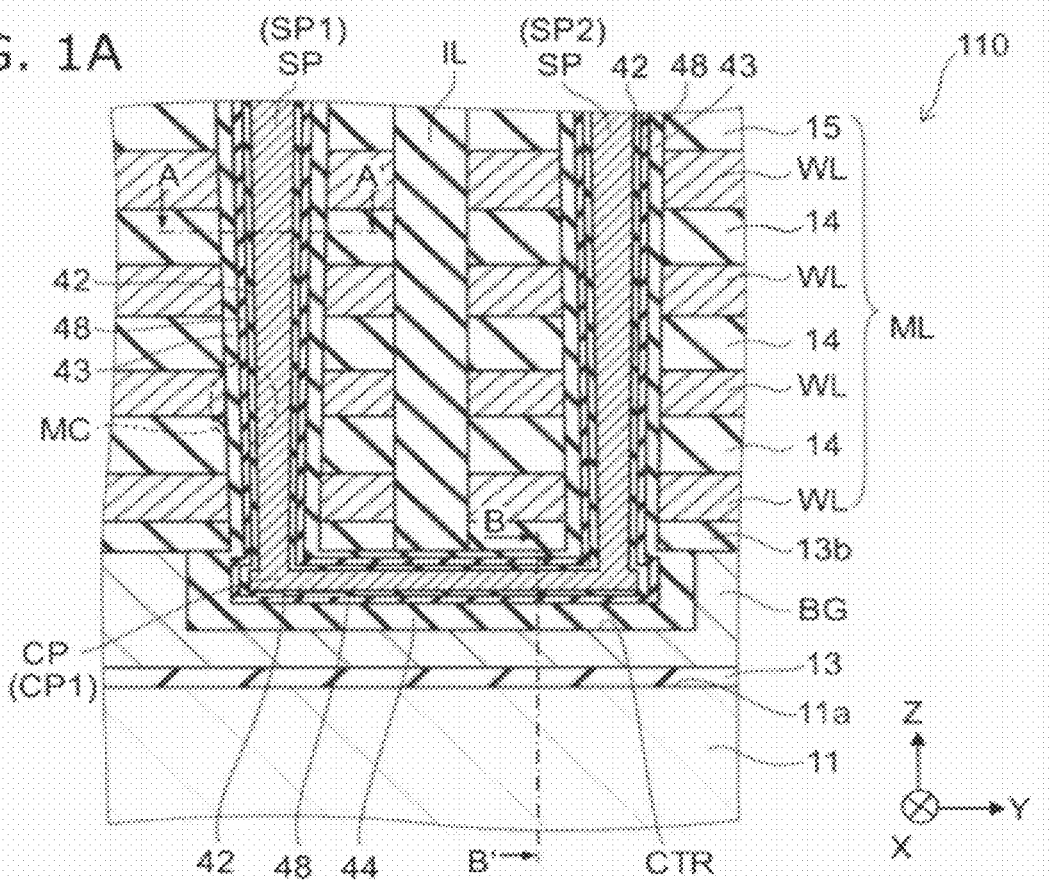
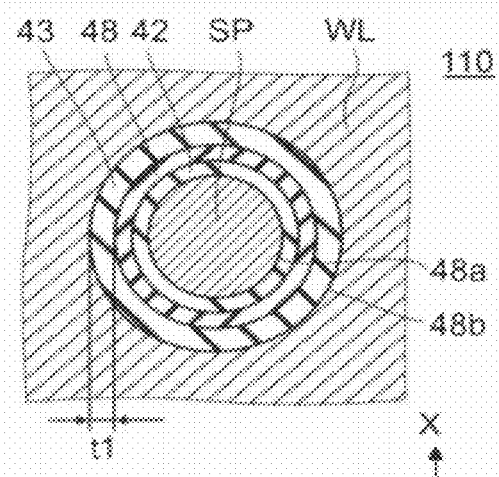
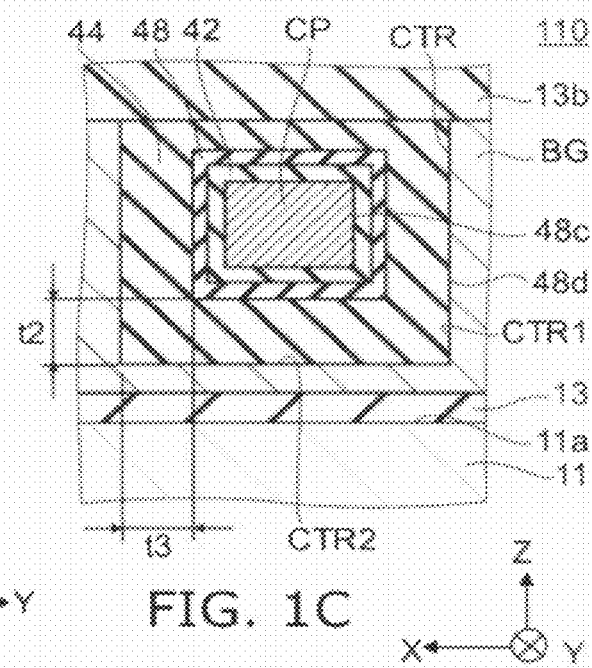
FIG. 1A
FIG. 1B
FIG. 1C

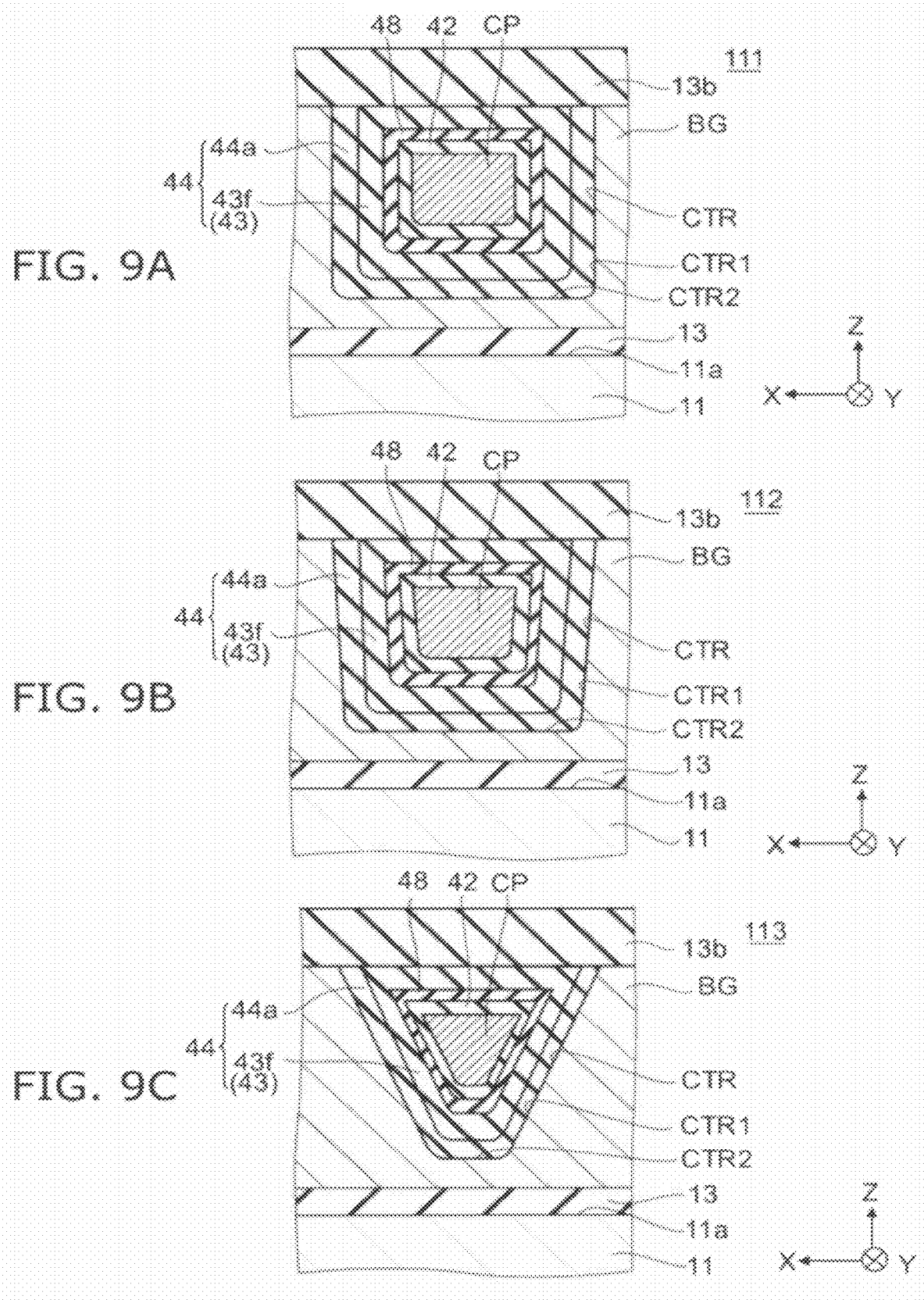

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-169954, filed on Jul. 21, 2009; the entire contents of which are incorporated herein by reference.

BACKGROUND

1. Field

Embodiments of the invention relate generally to a nonvolatile semiconductor memory device and a method for manufacturing the same.

2. Background Art

Nonvolatile semiconductor memory devices (memory) conventionally have elements integrated in a two-dimensional plane on a silicon substrate. Although the dimensions of one element are reduced (downscaled) to increase the memory capacity of the memory, such downscaling in recent years has become difficult in regard to both cost and technology.

On the other hand, although many ideas for three-dimensional memory, etc., have been proposed, three-dimensional devices generally require processes including at least three lithography processes for each layer. Therefore, costs cannot be reduced even when three dimensional; and instead, stacking four or more layers undesirably leads to cost increases.

Conversely, collectively patterned three-dimensionally stacked memory cells have been proposed (for example, refer to JP-A 2007-266143 (Kokai)). According to such a method, it is possible to collectively form a stacked memory without increasing the number of stacks. Therefore, it is possible to suppress cost increases.

In such a collectively patterned three dimensionally stacked memory, a stacked unit is formed on a silicon substrate by alternately stacking insulating films with electrode films forming word lines, and then collectively making through-holes in the stacked unit. Then, for example, a charge storage layer (a memory layer) is provided on the side faces of the through-holes; and silicon pillars are provided on the inner sides thereof. A tunneling insulating film is provided between the charge storage layer and the silicon pillars; and a blocking insulating film is provided between the charge storage layer and the electrode films. Thereby, a memory cell is formed at the intersection between the silicon pillars and each of the electrode films.

Further, two of the through-holes may be connected by a connection portion provided on the silicon substrate side to form a silicon pillar having a U-shaped configuration. In other words, a memory string made of a silicon pillar having a U-shaped structure can be formed by making a through-hole having a U-shaped configuration, forming a blocking insulating film, a charge storage layer, and a tunneling insulating film on the side wall thereof, and filling silicon into the remaining space.

SUMMARY

According to an aspect of the invention, there is provided a nonvolatile semiconductor memory device, including: a stacked structural unit including a plurality of electrode films alternately stacked in a first direction with a plurality of inter-electrode insulating films; a first semiconductor pillar piercing the stacked structural unit in the first direction; a second semiconductor pillar adjacent to the first semiconductor pillar in a second direction perpendicular to the first direction, the second semiconductor pillar piercing the stacked structural unit in the first direction; a connection portion semiconductor layer aligned in the second direction to electrically connect the first semiconductor pillar and the second semiconductor pillar on a same side in the first direction; a connection portion conductive layer provided to oppose the connection portion semiconductor layer; a memory layer provided between the first semiconductor pillar and each of the electrode films, between the second semiconductor pillar and each of the electrode films, and between the connection portion conductive layer and the connection portion semiconductor layer; an inner insulating film provided between the memory layer and the first semiconductor pillar, between the memory layer and the second semiconductor pillar, and between the memory layer and the connection portion semiconductor layer; an outer insulating film provided between the memory layer and each of the electrode films; and a connection portion outer insulating film provided between the memory layer and the connection portion conductive layer, the connection portion outer insulating film having a film thickness thicker than a film thickness of the outer insulating film.

According to another aspect of the invention, there is provided a method for manufacturing a nonvolatile semiconductor memory device, including: after making a trench in a conductive layer provided on a major surface of a substrate and forming an insulating film on a wall face of the trench, filling a sacrificial layer into a remaining space of the trench; alternately stacking a plurality of electrode films with a plurality of inter-electrode insulating films on the conductive layer, the insulating film, and the sacrificial layer in a first direction perpendicular to the major surface to form a stacked structural unit including the plurality of electrode films and the plurality of inter-electrode insulating films; making a first through-hole and a second through-hole to pierce the stacked structural unit in the first direction and reach the sacrificial layer, the first through-hole and the second through-hole being adjacent to each other in a second direction perpendicular to the first direction; and after removing the sacrificial layer via the first through-hole and the second through-hole to expose the insulating film, stacking an outer insulating film, a memory layer, and an inner insulating film on a wall face of the first through-hole, a wall face of the second through-hole, and a wall face of the exposed insulating film, and filling a semiconductor material into a remaining space of the first through-hole, the second through-hole, and the trench.

BRIEF DESCRIPTION OF THE DRAWINGS

FIGS. 1A to 1C are schematic cross-sectional views illustrating the configuration of a nonvolatile semiconductor memory device according to a first embodiment;

FIGS. 9A to 9C are schematic cross-sectional views illustrating the configurations of a main component of other nonvolatile semiconductor memory devices according to the first embodiment.

DETAILED DESCRIPTION

Figure 2:
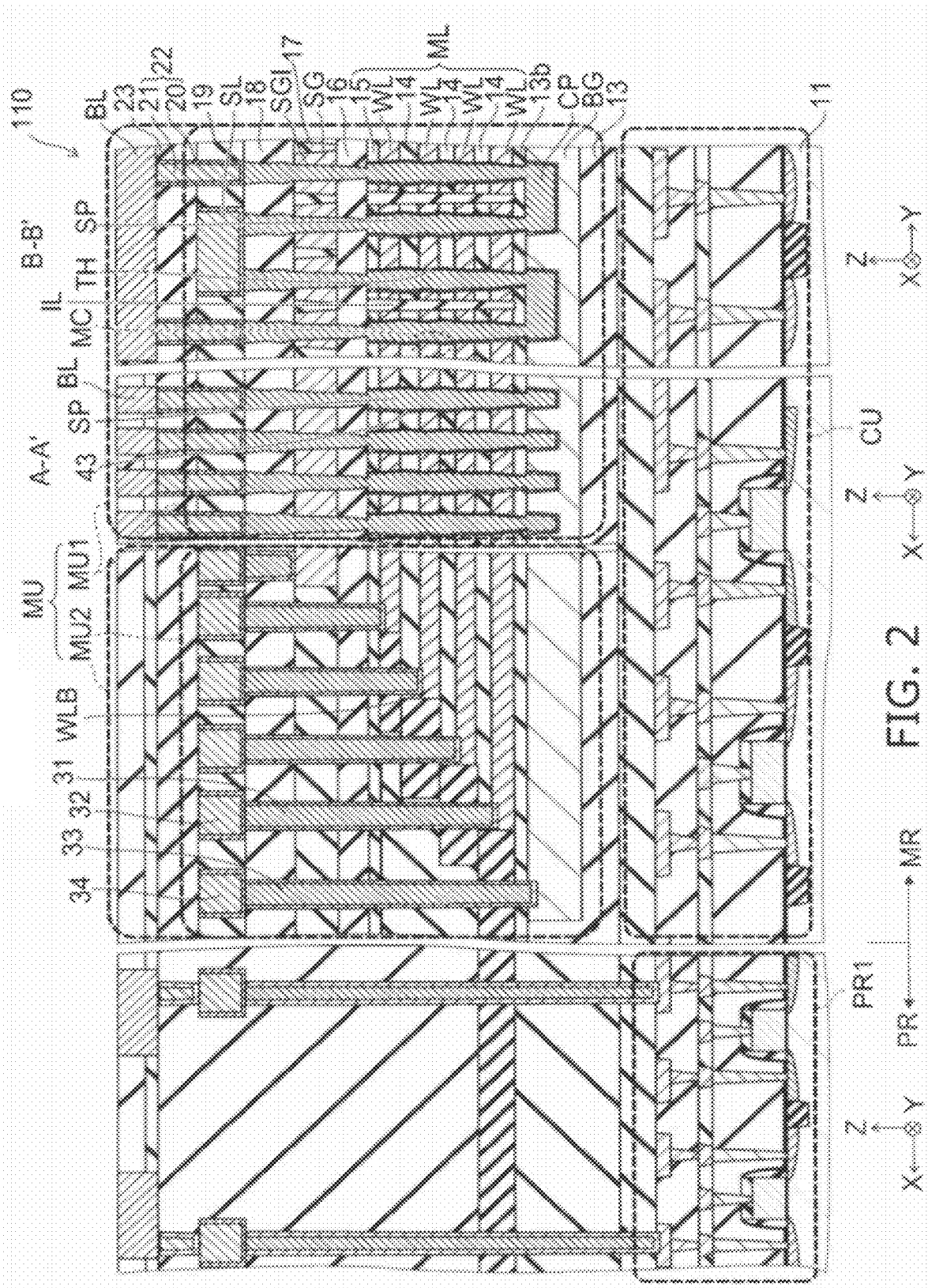
FIG. 2 is a schematic cross-sectional view illustrating the entire configuration of the nonvolatile semiconductor memory device according to the first embodiment.

Exemplary embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIGS. 1A to 1C are schematic cross-sectional views illustrating the configuration of a nonvolatile semiconductor memory device according to a first embodiment.

Namely, FIG. 1B is a cross-sectional view along line A-A' of FIG. 1A; and FIG. 1C is a cross-sectional view along line B-B' of FIG. 1A.

FIG. 2 is a schematic cross-sectional view illustrating the entire configuration of the nonvolatile semiconductor memory device according to the first embodiment.

Figure 3:
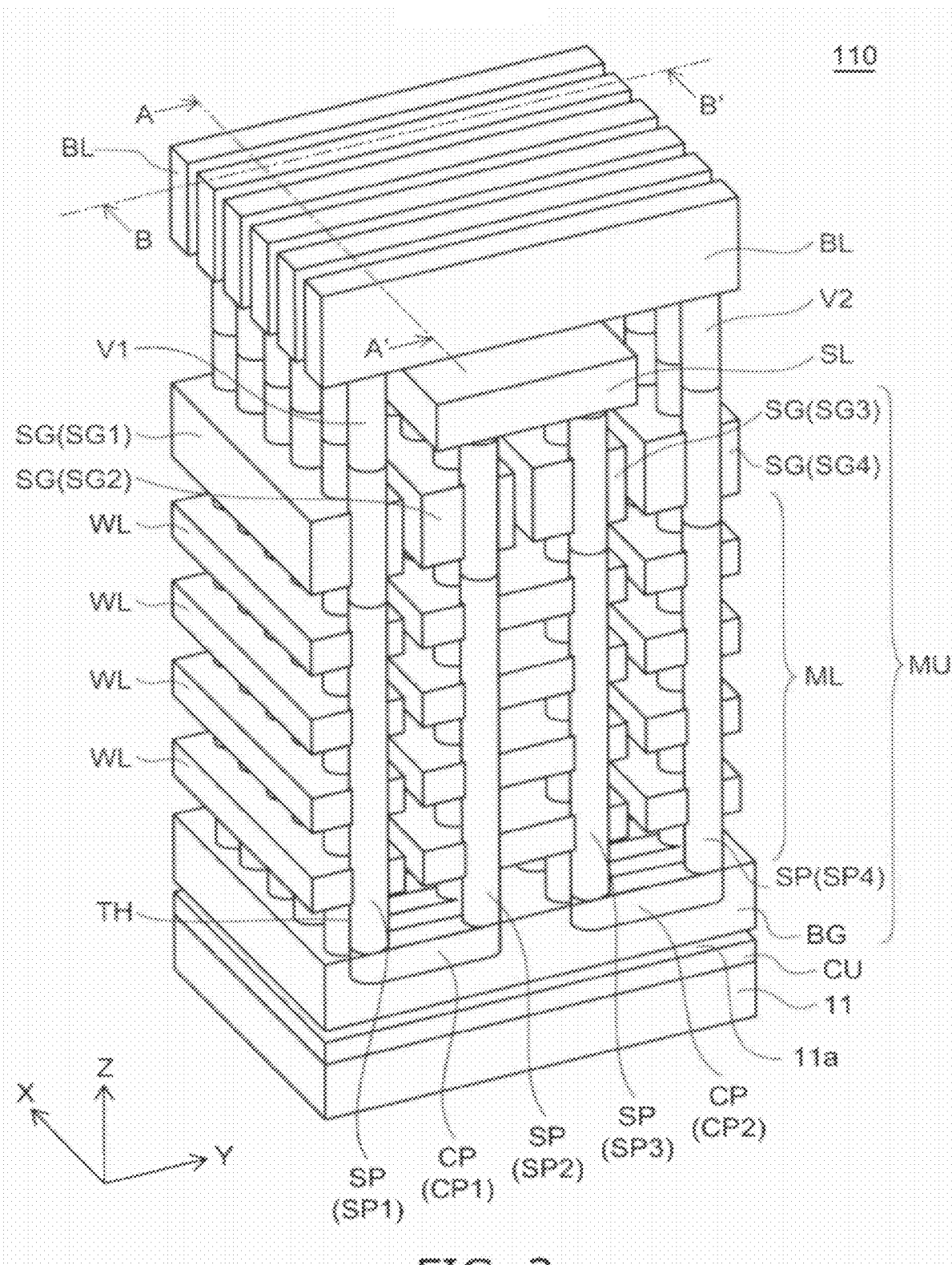
FIG. 3 is a schematic perspective view illustrating the configuration of the nonvolatile semiconductor memory device according to the first embodiment.

FIG. 3 is a schematic perspective view illustrating the configuration of the nonvolatile semiconductor memory device according to the first embodiment.

For easier viewing of the drawing in FIG. 3, only the conductive portions are illustrated, and the insulating portions are omitted.

Figure 4:
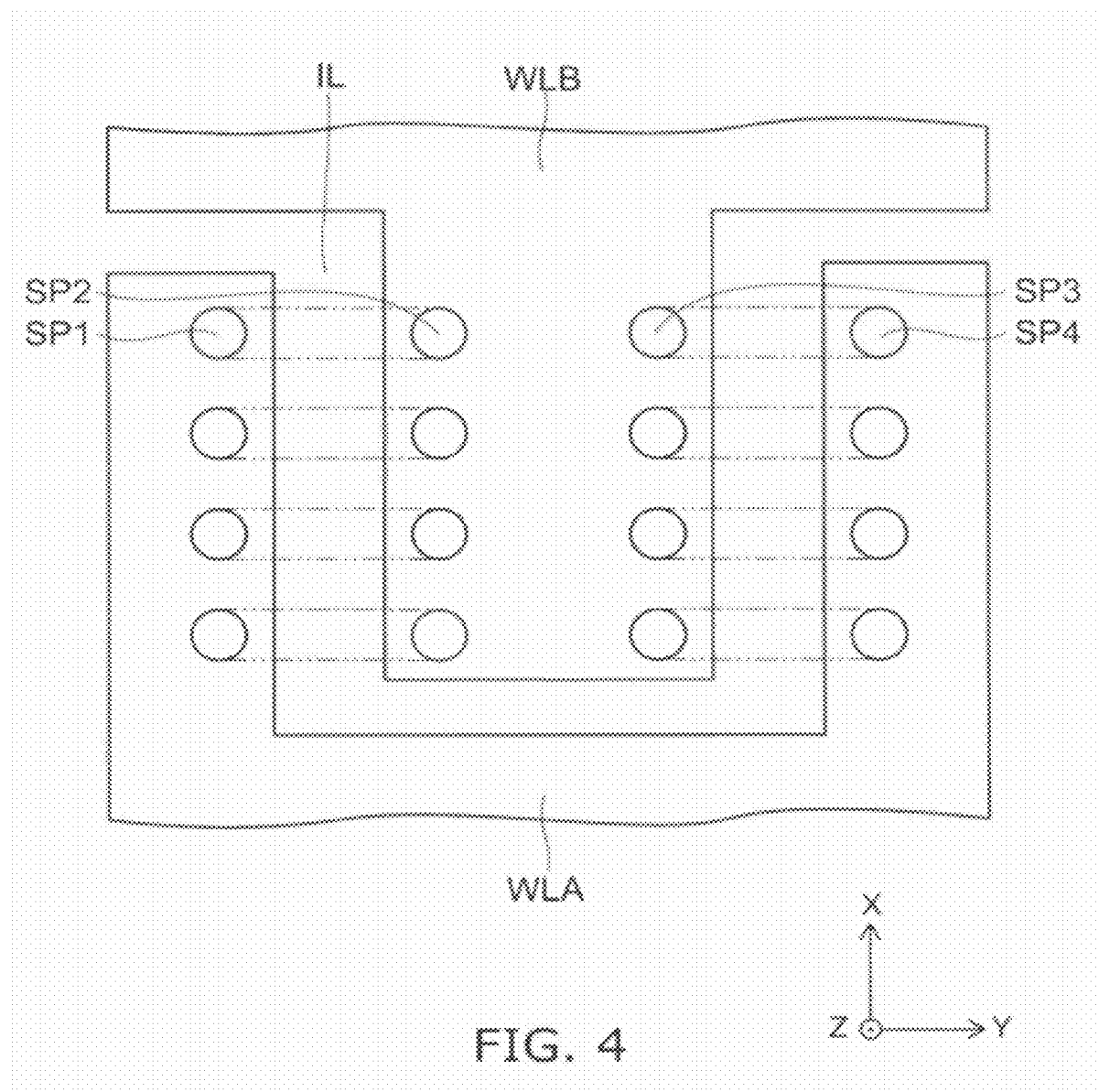
FIG. 4 is a schematic plan view illustrating the configuration of electrode films of the nonvolatile semiconductor memory device according to the first embodiment.

FIG. 4 is a schematic plan view illustrating the configuration of electrode films of the nonvolatile semiconductor memory device according to the first embodiment.

Figure 5:
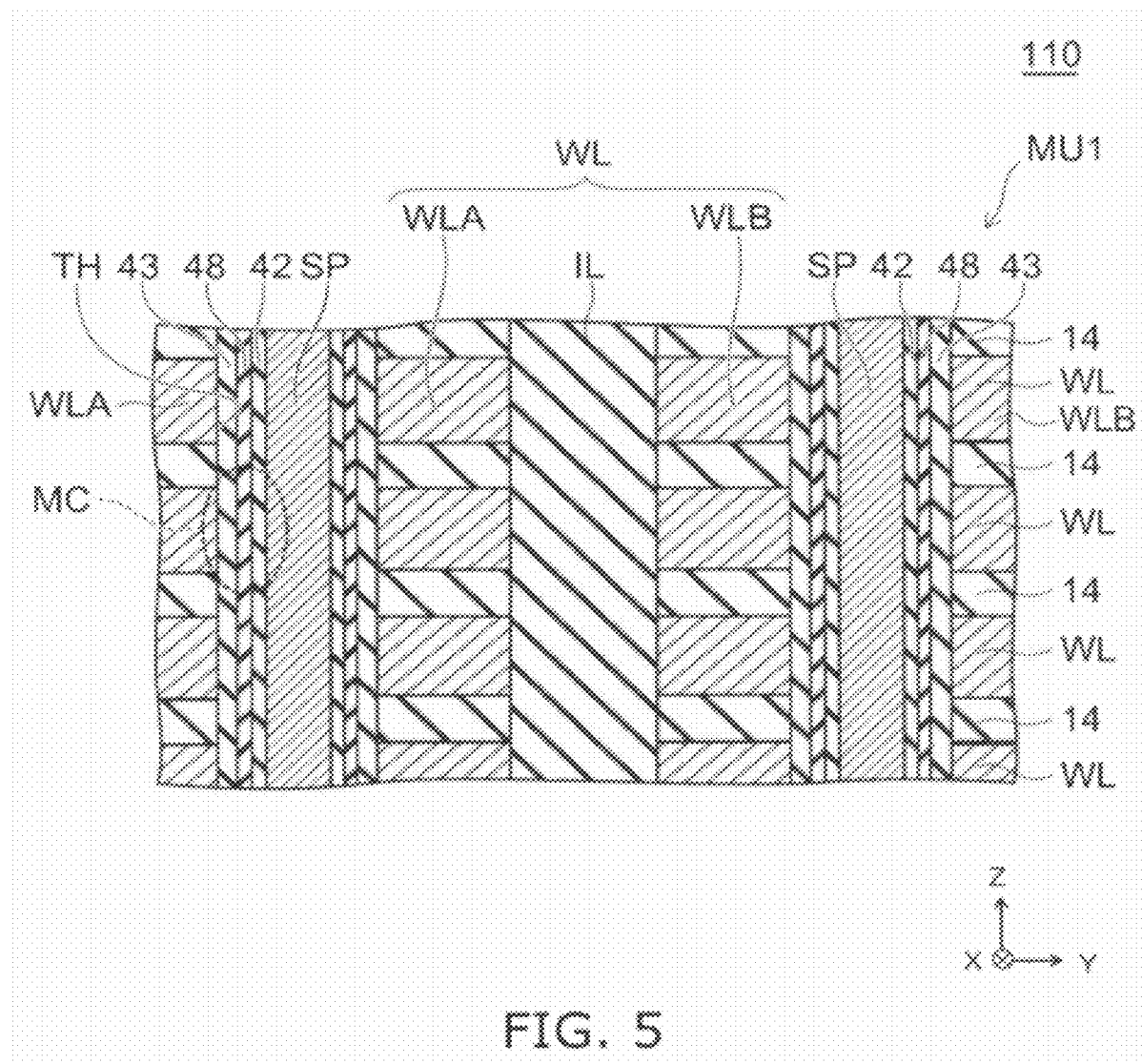
FIG. 5 is a schematic cross-sectional view illustrating the configuration of a portion of the nonvolatile semiconductor memory device according to the first embodiment.

FIG. 5 is a schematic cross-sectional view illustrating the configuration of a portion of the nonvolatile semiconductor memory device according to the first embodiment.

A nonvolatile semiconductor memory device 110 according to an embodiment of the invention is a three dimensionally stacked flash memory.

First, an overview of the entire configuration of the nonvolatile semiconductor memory device 110 will be described using FIG. 2 to FIG. 4.

As illustrated in FIG. 2, the nonvolatile semiconductor memory device 110 includes a semiconductor substrate 11 made of, for example, monocrystalline silicon.

In this specific example, a memory array region MR and a peripheral region PR are set in the semiconductor substrate 11. Memory cells are formed in the memory array region MR; and the peripheral region PR is provided, for example, peripherally to the memory array region MR. In the peripheral region PR, various peripheral region circuits PR1 are provided on the semiconductor substrate 11.

A circuit unit CU, for example, is provided on the semiconductor substrate 11 in the memory array region MR. A memory unit MU is provided on the circuit unit CU. The circuit unit CU may be provided as necessary, and may be omitted. An inter-layer insulating film 13 made of, for example, silicon oxide is provided between the circuit unit CU and the memory unit MU.

The memory unit MU includes a matrix memory cell unit MU1 and an interconnect connection unit MU2. The matrix memory cell unit MU1 includes memory cell transistors arranged in a three dimensional matrix configuration. The interconnect connection unit MU2 connects the interconnects of the matrix memory cell unit MU1.

FIG. 3 illustrates the configuration of the matrix memory cell unit MU1.

Namely, FIG. 2 illustrates a portion of the cross section along line A-A' of FIG. 3 and a portion of the cross section along line B-B' of FIG. 3 as the matrix memory cell unit MU1.

As illustrated in FIG. 2 and FIG. 3, a stacked structural unit ML is provided on a major surface 11a of the semiconductor substrate 11 in the matrix memory cell unit MU1. The stacked structural unit ML includes multiple electrode films WL alternately stacked with multiple inter-electrode insulating films 14 in a direction perpendicular to the major surface 11a.

An XYZ orthogonal coordinate system will now be introduced for convenience of description in the specification of the application. In this coordinate system, a direction perpendicular to the major surface 11a of the semiconductor substrate 11 is taken as a Z axis direction (the first direction). One direction in a plane parallel to the major surface 11a is taken as a Y axis direction (the second direction). A direction perpendicular to the Z axis and the Y axis is taken as an X axis direction (the third direction).

The stacking direction of the electrode films WL and the inter-electrode insulating films 14 in the stacked structural unit ML is the Z axis direction.

Memory cells MC are provided at intersections between the electrode films WL and semiconductor pillars SP of the stacked structural unit ML. In other words, a memory layer 48 is provided between a side face of the semiconductor pillar SP and the electrode films WL via an insulating film described below; and the memory layer 48 forms the memory unit of the memory cells MC.

FIG. 1A illustrates the configuration of the matrix memory cell unit MU1 and corresponds to, for example, a portion of the cross section along line B-B' of FIG. 3.

As illustrated in FIGS. 1A to 1C, the nonvolatile semiconductor memory device 110 includes: the stacked structural unit ML having multiple electrode films WL alternately stacked in the Z axis direction with multiple inter-electrode insulating films 14; a first semiconductor pillar SP1 (the semiconductor pillar SP) piercing the stacked structural unit ML in the Z axis direction; and a second semiconductor pillar SP2 (the semiconductor pillar SP) piercing the stacked structural unit ML in the Z axis direction, where the second semiconductor pillar SP2 is adjacent to the first semiconductor pillar SP1 in, for example, the Y axis direction.

The memory layer 48 is provided between the semiconductor pillar SP and each of the electrode films WL. An inner insulating film 42 is provided between the memory layer 48 and the semiconductor pillar SP. An outer insulating film 43 is provided between the memory layer 48 and each of the electrode films WL.

Two of the semiconductor pillars SP are connected by a connection portion CP (the connection portion semiconductor layer) on the substrate side. In other words, a back gate BG (the connection portion conductive layer) is provided on the major surface 11a of the semiconductor substrate 11 via the inter-layer insulating film 13. A trench CTR is made in a portion of the back gate BG to oppose the first and second semiconductor pillars SP1 and SP2. A connection portion outer insulating film 44, the memory layer 48, and the inner insulating film 42 are formed in the interior of the trench CTR. The connection portion CP made of a semiconductor is filled into the remaining space thereof. Thereby, a semiconductor pillar having a U-shaped configuration is formed of the first and second semiconductor pillars SP1 and SP2 and the connection portion CP.

As described below, the film thickness of the connection portion outer insulating film 44 opposing the connection portion CP is thicker than that of the outer insulating film 43 opposing the semiconductor pillar SP.

As illustrated in FIG. 1B, the cross section of the semiconductor pillar SP when cut in the X-Y plane is circular (including circular, elliptic, and various flattened circular shapes). In other words, the inner insulating film 42, the memory layer 48, and the outer insulating film 43 have concentric circular annular cylindrical configurations centered on the center of the circle of the semiconductor pillar SP.

In other words, an inner interface 48a between the semiconductor pillar SP (the first and second semiconductor pillars SP1 and SP2) and the inner insulating film 42 opposing the semiconductor pillar SP and an outer interface 48b between the outer insulating film 43 and the electrode films WL have recessed curved surfaces on the semiconductor pillar SP side.

The curvature of the inner interface 48a when the inner interface 48a is cut in the X-Y plane is greater than the curvature of the outer interface 48b when the outer interface 48b is cut in the X-Y plane. In other words, the curvature of the inner insulating film 42 is greater than the curvature of the outer insulating film 43.

Herein, the curvature is the reciprocal of the radius of a circle approximating the interface recited above. Accordingly, the curvature radius of the inner insulating film 42 is smaller than the curvature radius of the outer insulating film 43.

Herein, the thickness of the outer insulating film 43 is a film thickness t1.

On the other hand, as illustrated in FIG. 1C, a side face CTR1 and a bottom face CTR2 of the trench CTR of the back gate BG provided on the major surface 11a of the semiconductor substrate 11 via the inter-layer insulating film 13 are substantially planar. The connection portion outer insulating film 44, the memory layer 48, the inner insulating film 42, and the connection portion CP are filled into the interior of such a trench CTR.

At least a portion of at least one selected from the connection portion outer insulating film 44, the memory layer 48, the inner insulating film 42, and the connection portion CP may be filled into the interior of the trench CTR. Portions of the connection portion outer insulating film 44, the memory layer 48, the inner insulating film 42, and the connection portion CP exposed from the trench CTR may be covered with an inter-layer insulating film 13b and the like provided thereupon.

It is sufficient for the back gate BG to be provided opposing the connection portion CP. For example, an inter-layer insulating film having a trench may be provided on the back gate BG; and the connection portion outer insulating film 44, the memory layer 48, the inner insulating film 42, and the connection portion CP may be filled into the interior of the trench. In other words, the connection portion outer insulating film 44, the memory layer 48, the inner insulating film 42, and the connection portion CP may not be filled into the back gate BG.

As illustrated in FIG. 1C, a connection portion outer interface 48d between the connection portion outer insulating film 44 and the memory layer 48 has a planar portion.

Specifically, portions of the connection portion outer interface 48d between the connection portion outer insulating film 44 and the back gate BG opposing the side face CTR1 and the bottom face CTR2 of the trench CTR do not have curvatures. Further, a connection portion inner interface 48c opposing the back gate BG between the inner insulating film 42 and the connection portion CP does not have a curvature at portions opposing the side face CTR1 and the bottom face CTR2 of the trench CTR.

The connection portion inner interface 48c and the connection portion outer interface 48d have portions where the connection portion inner interface 48c and the connection portion outer interface 48d are planes parallel to each other.

Here, the film thickness of the connection portion outer insulating film 44 may be taken to be a film thickness t3 of the side face CTR1 or a film thickness t2 of the bottom face CTR2.

The film thickness t2 and the film thickness t3 are greater (thicker) than the film thickness t1.

The outer insulating film 43 provided to oppose the semiconductor pillar SP may be formed collectively with at least a portion of an inner portion (the portion on the connection portion CP side) of the connection portion outer insulating film 44 provided to oppose the connection portion CP. In other words, the same material may be used as the outer insulating film 43 and at least a portion of the inner portion of the connection portion outer insulating film 44.

The portion of the memory layer 48 opposing the semiconductor pillar SP may be formed collectively with the portion of the memory layer 48 opposing the connection portion CP. In other words, the same material may be used as the portion of the memory layer 48 opposing the semiconductor pillar SP and the portion of the memory layer 48 opposing the connection portion CP.

Also, the portion of the inner insulating film 42 opposing the semiconductor pillar SP may be formed collectively with the portion of the inner insulating film 42 opposing the connection portion CP. In other words, the same material may be used as the portion of the inner insulating film 42 opposing the semiconductor pillar SP and the portion of the inner insulating film 42 opposing the connection portion CP.

The semiconductor pillar SP may be formed collectively with the connection portion CP. In other words, the same material may be used as the semiconductor pillar SP and the connection portion CP.

Cell transistors including the memory layer 48 are formed at portions where the electrode films WL intersect the semiconductor pillars SP. The cell transistors are arranged in a three dimensional matrix configuration. The cell transistors function as the memory cells MC to store data by storing charge in the memory layer 48.

In other words, the inner insulating film 42 functions as a tunneling insulating film of the cell transistor of the memory cell MC.

On the other hand, the outer insulating film 43 functions as a blocking insulating film of the cell transistor of the memory cell MC.

The inter-electrode insulating film 14 functions as an inter-layer insulating film to insulate the electrode films WL from each other.

The electrode film WL may include any conductive material. For example, amorphous silicon, polysilicon, and the like having an impurity introduced to provide electrical conductivity may be used; and metals, alloys, etc., also may be used. A prescribed electrical signal is applied to the electrode film WL; and the electrode film WL functions as a word line of the nonvolatile semiconductor memory device 110.

The inter-electrode insulating film 14, the inner insulating film 42, the outer insulating film 43, and the connection portion outer insulating film 44 may include, for example, a silicon oxide film.

The memory layer 48 may include, for example, a silicon nitride film and functions as a portion that stores information by storing or emitting charge due to an electric field applied between the semiconductor pillar SP and the electrode films WL. The memory layer 48 may be a single-layer film or a stacked film.

As described below, the inter-electrode insulating film 14, the inner insulating film 42, the memory layer 48, the outer insulating film 43, and the connection portion outer insulating film 44 are not limited to the materials recited above. Any material may be used.

As recited above, the memory cells MC are provided at the portions of the first and second semiconductor pillars SP1 and SP2. The memory cells MC form the memory units of the nonvolatile semiconductor memory device 110. On the other hand, although the connection portion CP has a function of electrically connecting the first and second semiconductor pillars SP1 and SP2 to each other, the connection portion CP also may be utilized as one memory cell. Thereby, the number of memory bits can be increased. The case will now be described where the memory cells MC are provided in the first and second semiconductor pillars SP1 and SP2; and the connection portion CP electrically connects the first and second semiconductor pillars SP1 and SP2 and is not used as a memory unit.

Although the memory layer 48 opposing the connection portion CP does not function as a memory unit in such a case, the portion of the memory layer 48 opposing the connection portion CP also is referred to as a memory layer to simplify the description. In such a case, the inner insulating film 42, the memory layer 48, and the connection portion outer insulating film 44 provided between the connection portion CP and the back gate BG function as a gate insulating film between the connection portion CP and the back gate BG.

Although FIG. 1A, FIG. 2, and FIG. 3 illustrate the case of four layers of the electrode films WL, any number of the electrode films WL may be provided in the stacked structural unit ML.

As illustrated in FIG. 5, the electrode film WL between semiconductor pillars SP adjacent in the Y axis direction is divided by an insulating layer IL; and the electrode film WL is divided into a first region (an electrode film WLA) and a second region (an electrode film WLB).

As illustrated in FIG. 2 and FIG. 3, a selection gate electrode SG is provided on the stacked structural unit ML. The selection gate electrode SG may include any conductive material. For example, polysilicon or amorphous silicon may be used. The selection gate electrodes SG is formed by dividing a conductive film along a constant direction. In this specific example, the selection gate electrode SG is divided in the Y axis direction. In other words, the selection gate electrode SG has a band configuration aligned along the X axis direction.

As illustrated in FIG. 2, an inter-layer insulating film 15 is provided in the uppermost portion (the side most distal to the semiconductor substrate 11) of the stacked structural unit ML. An inter-layer insulating film 16 is provided on the stacked structural unit ML; the selection gate electrodes SG are provided thereupon; and an inter-layer insulating film 17 is provided between the selection gate electrodes SG. A through-hole is provided in the selection gate electrode SG; a selection gate insulating film SGI of the selection gate transistor is provided on the inner side face thereof; and a semiconductor is filled onto the inner side thereof. The semiconductor communicates with the semiconductor pillar SP.

An inter-layer insulating film 18 is provided on the inter-layer insulating film 17; and a source line SL and a via 22 are provided thereupon. An inter-layer insulating film 19 is provided around the source line SL. The via 22 includes a stacked film of a barrier layer 20 and a metal layer 21.

An inter-layer insulating film 23 is provided on the source line SL; and a bit line BL is provided thereupon. The bit line BL has a band configuration along the Y axis. The inter-layer insulating films 15, 16, 17, 18, 19, and 23 and the selection gate insulating film SGI may include, for example, silicon oxide.

Multiple through-holes TH are made in the stacked structural unit ML and the selection gate electrode SG to align in the stacking direction (the Z axis direction). An insulating film is provided on the side faces of the interiors thereof. A semiconductor material is filled into the space on the inner side thereof to form the semiconductor pillars SP. In other words, the semiconductor pillar SP provided in the stacked structural unit ML also pierces the selection gate electrode SG at the upper portion of the stacked structural unit ML.

Herein, in regard to the semiconductor pillar being multiply provided in the nonvolatile semiconductor memory device 110, "semiconductor pillar SP" is used to refer to all of the semiconductor pillars or any semiconductor pillar; and "nth semiconductor pillar SPn" (and being any integer not less than 1) is used to refer to a designated semiconductor pillar when describing the relationship among semiconductor pillars, etc. This similarly applies to the other components. For example, "connection portion CP" is used to refer to all of the connection portions or any connection portion; and "nth connection portion CPn" (n being any integer not less than 1) is used to refer to a designated connection portion.

In the nonvolatile semiconductor memory device 110, the first semiconductor pillar SP1 and the second semiconductor pillar SP2 are connected by a first connection portion CP1 (the connection portion CP) as illustrated in FIG. 3. A third semiconductor pillar SP3 and a fourth semiconductor pillar SP4 are connected by a second connection portion CP2 (the connection portion CP).

In other words, the first and second semiconductor pillars SP1 and SP2 are connected as a pair by the first connection portion CP1 (the connection portion CP) to form one NAND string having a U-shaped configuration. The third and fourth semiconductor pillars SP3 and SP4 are connected as a pair by the second connection portion CP2 to form another NAND string having a U-shaped configuration.

As illustrated in FIG. 4, for the electrode films WL, the electrode films corresponding to the semiconductor pillars SP(4 m+1) and SP(4 m+4) are commonly connected to form an electrode film WLA, where m is an integer not less than 0 and n recited above is (4 m+1) and (4 m+4); and the electrode films corresponding to the semiconductor pillars SP(4 m+2) and SP(4 m+3) are commonly connected to form an electrode film WLB, where n is (4 m+2) and (4 m+3). In other words, the electrode films WL have a configuration in which the electrode film WLA and the electrode film WLB are combined with each other in a comb teeth configuration opposing in the X-axis direction.

As in the interconnect connection unit MU2 illustrated in FIG. 2, the electrode film WLB is connected at one end in the X axis direction to a word line 32 by a via plug 31 and is electrically connected to, for example, a drive circuit provided on the semiconductor substrate 11. Similarly, the electrode film WLA is connected at the other end in the X axis direction to the word line by the via plug and is electrically connected to the drive circuit. In other words, the length in the X axis direction of each of the electrode films WL (the electrode films WLA and the electrode films WLB) stacked in the Z axis direction changes in a stairstep configuration; and the electrode films WL are electrically connected to the drive circuit by the electrode films WLA at one end in the X axis direction and by the electrode films WLB at the other end in the X axis direction.

Thereby, for the electrode films WL at the same distance from the semiconductor substrate 11, different potentials can be set for the pair of the first semiconductor pillar SP1 and the second semiconductor pillar SP2. Thereby, the memory cells of the same layer corresponding to the first semiconductor pillar SP1 and the second semiconductor pillar SP2 can be operated independently from each other. This is similar for the third semiconductor pillar SP3 and the fourth semiconductor pillar SP4.

The combination of the electrode film WLA and the electrode film WLB can be taken to be one erasing block; and the electrode film WLA and the electrode film WLB can be divided from other electrode films WLA and electrode films WLB for each erasing block.

The number of the semiconductor pillars included in each of the erasing blocks in the X axis direction and the Y axis direction is arbitrary.

The back gate BG is connected to a back gate interconnect 34 by a via plug 33.

As illustrated in FIG. 2 and FIG. 3, each of the ends of the semiconductor pillars SP opposite to the connection portion CP is connected to the bit line BL or the source line SL; and the selection gate electrode SG (the first to fourth selection gate electrodes SG1 to SG4) is provided on each of the semiconductor pillars SP. Thereby, the desired data can be written to or read from any of the memory cells MC of any of the semiconductor pillars SP.

Thus, the nonvolatile semiconductor memory device 110 includes the stacked structural unit ML, the first semiconductor pillar SP1, the second semiconductor pillar SP2, the first connection portion CP1 (the connection portion CP), the back gate BG, a first memory layer (the memory layer 48), a first inner insulating film (the inner insulating film 42), a first outer insulating film (the outer insulating film 43), and a first connection portion outer insulating film (the connection portion outer insulating film 44).

The stacked structural unit ML includes the multiple electrode films WL alternately stacked in the Z axis direction with the multiple inter-electrode insulating films 14.

The first semiconductor pillar SP1 pierces the stacked structural unit ML in the Z axis direction. The second semiconductor pillar SP2 is adjacent to the first semiconductor pillar SP1 in the Y axis direction and pierces the stacked structural unit ML in the Z axis direction.

The first connection portion CP1 electrically connects the first semiconductor pillar SP1 and the second semiconductor pillar SP2 on the same side (the semiconductor substrate 11 side) in the Z axis direction. The first connection portion CP1 is provided to align in the Y axis direction and is made of the same material as the first semiconductor pillar SP1 and the second semiconductor pillar SP2.

The back gate BG is provided to oppose the first connection portion CP1.

The first memory layer 48 is provided between the first semiconductor pillar SP1 and each of the electrode films WL, between the second semiconductor pillar SP2 and each of the electrode films WL, and between the back gate BG and the first connection portion CP1.

The first inner insulating film 42 is provided between the first memory layer 48 and the first semiconductor pillar SP1, between the first memory layer 48 and the second semiconductor pillar SP2, and between the first memory layer 48 and the first connection portion CP1.

The first outer insulating film 43 is provided between the first memory layer 48 and each of the electrode films WL.

The first connection portion outer insulating film 44 is provided between the first memory layer 48 and the back gate BG. The film thickness of the first connection portion outer insulating film 44 is thicker than that of the first outer insulating film 43.

The film thickness of the first outer insulating film 43 (the outer insulating film 43) is the distance between the electrode film WL and the first memory layer 48 (the memory layer 48) and is the thickness of the first outer insulating film 43 (the outer insulating film 43) in a direction perpendicular to the Z axis.

On the other hand, the film thickness of the first connection portion outer insulating film 44 (the connection portion outer insulating film 44) is the distance between the back gate WL and the first memory layer 48 (the memory layer 48). The film thickness of the first connection portion outer insulating film 44 may be the thickness (the film thickness t3) of the first connection portion outer insulating film 44 in the X axis direction or the thickness (the film thickness t2) of the first connection portion outer insulating film 44 in the Z axis direction.

The nonvolatile semiconductor memory device 110 may further include the bit line BL and the source line SL.

The bit line BL is aligned in the Y axis direction and is connected to a first end portion of the first semiconductor pillar SP1 on the side opposite to the first connection portion CP1. The source line SL is aligned in the X axis direction and is connected to a second end portion of the second semiconductor pillar SP2 on the side opposite to the first connection portion CP1.

The nonvolatile semiconductor memory device 110 may further include the third semiconductor pillar SP3, the fourth semiconductor pillar SP4, the second connection portion CP2, the second memory layer (the memory layer 48), the second inner insulating film (the inner insulating film 42), the second outer insulating film (the outer insulating film 43), and the second connection portion outer insulating film (the connection portion outer insulating film 44).

The third semiconductor pillar SP3 is adjacent to the second semiconductor pillar SP2 in the Y axis direction on the side of the second semiconductor pillar SP2 opposite to the first semiconductor pillar SP1 and pierces the stacked structural unit ML in the Z axis direction. The fourth semiconductor pillar SP4 is adjacent to the third semiconductor pillar SP3 in the Y axis direction on the side of the third semiconductor pillar SP3 opposite to the second semiconductor pillar SP2 and pierces the stacked structural unit ML in the Z axis direction. The third semiconductor pillar SP3 and the fourth semiconductor pillar SP4 are made of the same material as the first semiconductor pillar SP1 and the second semiconductor pillar SP2.

The second connection portion CP2 electrically connects the third semiconductor pillar SP3 and the fourth semiconductor pillar SP4 on the same side (the same side as the first connection portion CP1) in the Z axis direction. The second connection portion CP2 is provided to align in the Y axis direction and is made of the same material as the third semiconductor pillar SP3 and the fourth semiconductor pillar SP4. The second connection portion CP2 opposes the back gate BG.

The second memory layer 48 is provided between the third semiconductor pillar SP3 and each of the electrode films WL, between the fourth semiconductor pillar SP4 and each of the electrode films WL, and between the back gate BG and the second connection portion CP2.

The second inner insulating film 42 is provided between the second memory layer 48 and the third semiconductor pillar SP3, between the second memory layer 48 and the fourth semiconductor pillar SP4, and between the second memory layer 48 and the second connection portion CP2.

The second outer insulating film 43 is provided between the second memory layer 48 and each of the electrode films WL.

The second connection portion outer insulating film 44 is provided between the second memory layer 48 and the back gate BG. The film thickness of the second connection portion outer insulating film 44 is thicker than the second outer insulating film 43.

The source line SL is connected to a third end portion of the third semiconductor pillar SP3 on the side opposite to the second connection portion CP2. The bit line BL is connected to a fourth end portion of the fourth semiconductor pillar SP4 on the side opposite to the second connection portion CP2.

In the nonvolatile semiconductor memory device 110 having such a structure, the wall face (the side face CTR1 and the bottom face CTR2) of the trench CTR of the back gate BG opposing the connection portion CP (the first and second connection portions CP1 and CP2) has a planar portion. Although there is no difference in the curvatures of the blocking insulating film and the tunneling insulating film at the planar portion, the electric field of the connection portion outer insulating film 44 can be lower than that of the inner insulating film 42 by making the thickness (the film thickness t2 and the film thickness t3) of the connection portion outer insulating film 44 thicker than the thickness (the film thickness t1) of the outer insulating film 43 opposing the semiconductor pillar SP.

Operations of the nonvolatile semiconductor memory device 110 will now be described in comparison to a comparative example.

FIGS. 6A to 6F are schematic views illustrating characteristics of nonvolatile semiconductor memory devices of the first embodiment and the comparative example.

Figure 6A:
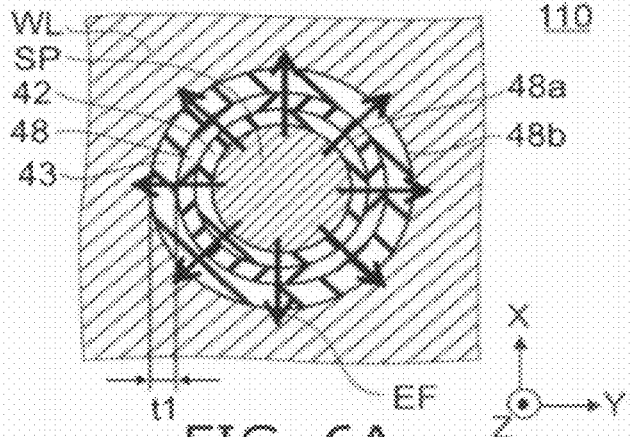
FIGS. 6A to 6F are schematic views illustrating characteristics of nonvolatile semiconductor memory devices of the first embodiment and a comparative example.
Figure 6B:
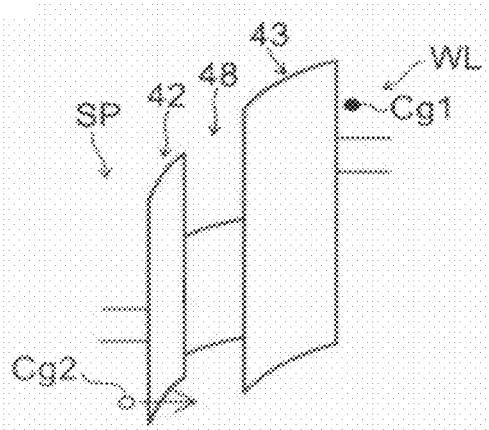
Figure 6C:
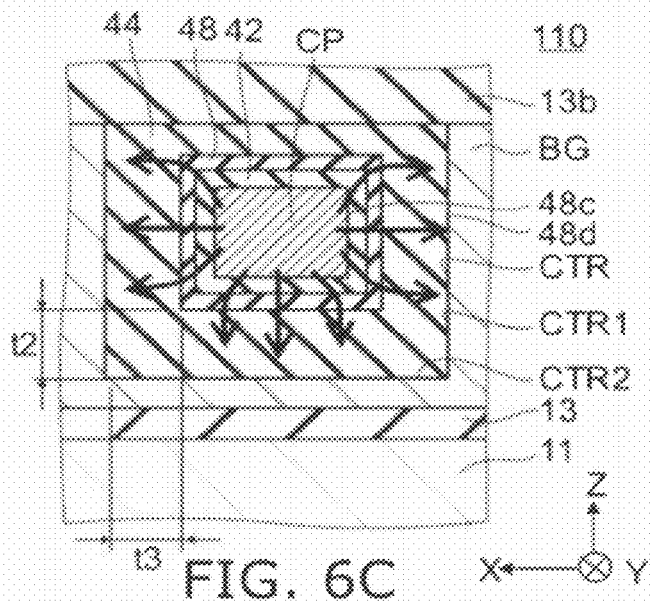
Figure 6D:
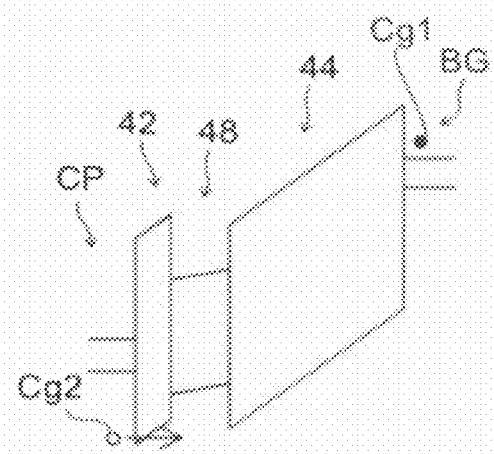

Namely, FIGS. 6A to 6D illustrate characteristics of the nonvolatile semiconductor memory device 110 according to this embodiment. FIGS. 6A and 6C illustrate the appearance of the electric field of the semiconductor pillar SP and the connection portion CP, respectively; and FIGS. 6B and 6D are energy band diagrams of the semiconductor pillar SP and the connection portion CP, respectively.

Figure 6E:
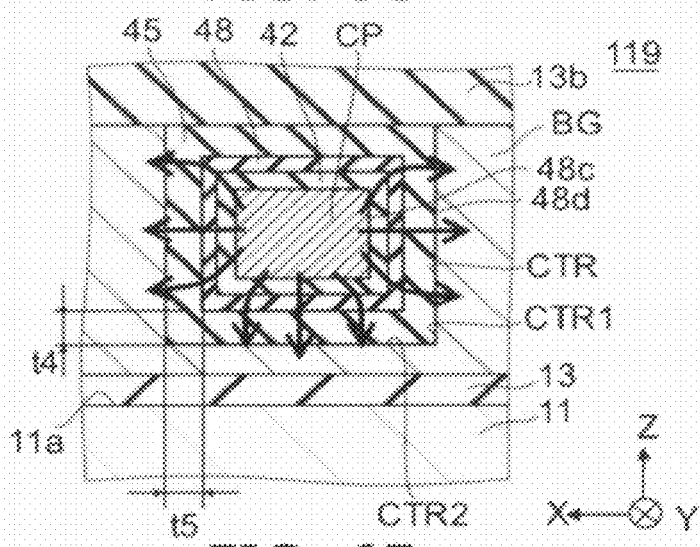
Figure 6F:
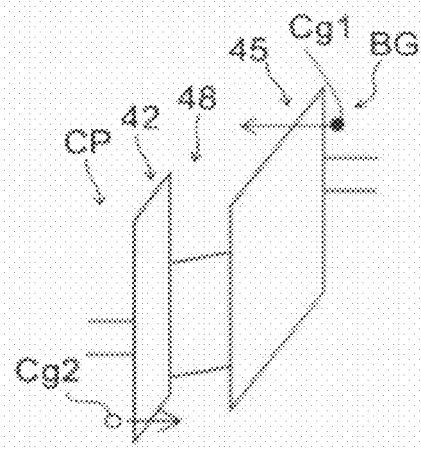

FIG. 6E illustrates the appearance of the electric field of the connection portion CP of a nonvolatile semiconductor memory device 119 of the comparative example; and FIG. 6F is an energy band diagram of the same.

Other than the thickness (the film thickness t4 and the film thickness t5) of a connection portion outer insulating film 45 of the connection portion CP being set to the same thickness (the film thickness t1) of the outer insulating film 43 opposing the semiconductor pillar SP, the nonvolatile semiconductor memory device 119 of the comparative example has the same configuration as the nonvolatile semiconductor memory device 110 according to this embodiment.

As illustrated in FIG. 6A, during the erasing operation of the nonvolatile semiconductor memory device 110, an erasing bias voltage is applied in which the potential of the semiconductor pillar SP is set relatively higher than that of the electrode film WL. At this time, an electric field EF occurs and spreads radially from the semiconductor pillar SP toward the electrode film WL. The curvature of the outer insulating film 43 is smaller than the curvature of the inner insulating film 42 at the semiconductor pillar SP portion. As a result, the electric field EF of the outer insulating film 43 is lower than that of the inner insulating film 42.

As a result, as illustrated in FIG. 6B, holes Cg2 are injected from the semiconductor pillar SP toward the inner insulating film 42 having a high electric field EF; and the information written to the memory layer 48 is erased. At this time, the electric field EF of the outer insulating film 43 is low. Therefore, electrons Cg1 are not injected from the electrode film WL toward the outer insulating film 43.

Thus, by providing a difference between the curvature of the inner insulating film 42 and the curvature of the outer insulating film 43 and providing a difference in the electric fields EF, the reverse injection of the electrons Cg1 into the outer insulating film 43 is suppressed when the erasing bias voltage is applied even in the case where the same material such as a silicon oxide film is used as the inner insulating film 42 and the outer insulating film 43.

In the connection portion CP, the side face CTR1 and the bottom face CTR2 of the trench CTR are planar as illustrated in FIG. 6C. In such a case, the electric field EF is oriented in directions perpendicular to the planes. Therefore, the electric field EF of the inner insulating film 42 and the electric field EF of the connection portion outer insulating film 44 are parallel to each other. In such a case, in the nonvolatile semiconductor memory device 110, the thickness (the film thickness t2 and the film thickness t3) of the connection portion outer insulating film 44 is thicker than the thickness (the film thickness t1) of the outer insulating film 43 of the semiconductor pillar SP portion. Therefore, the electric field EF applied to the connection portion outer insulating film 44 can be lower than the electric field EF applied to the outer insulating film 43.

As a result, as illustrated in FIG. 6D, the injection of electrons from the back gate BG toward the connection portion outer insulating film 44 can be suppressed.

On the other hand, in the nonvolatile semiconductor memory device 119 of the comparative example, the side face CTR1 and the bottom face CTR2 of the trench CTR are planar; and the electric field EF of the inner insulating film 42 and the electric field EF of the outer insulating film 43 are parallel to each other at these portions as illustrated in FIG. 6E. The thickness (the film thickness t4 and the film thickness t5) of the connection portion outer insulating film 45 is the same as the thickness (the film thickness t1) of the outer insulating film 43 at the semiconductor pillar SP portion. Therefore, the electric field EF applied to the connection portion outer insulating film 45 is greater than the electric field EF applied to the outer insulating film 43. In other words, the connection portion outer insulating film 45 is planar and therefore does not provided an effect of mitigating the electric field as does the outer insulating film 43 having a curvature.

As a result, as illustrated in FIG. 6F, simultaneously with the holes Cg2 being injected from the connection portion CP toward the inner insulating film 42, the electrons Cg1 are undesirably injected from the back gate BG into the connection portion outer insulating film 45 to which the electric field EF similar to that of the inner insulating film 42 is applied.

Conversely, in the nonvolatile semiconductor memory device 110 according to this embodiment, by making the thickness of the connection portion outer insulating film 44 opposing the connection portion CP thicker than that of the outer insulating film 43 opposing the semiconductor pillar SP, the electric field of the entirety can be reduced. Thereby, according to the nonvolatile semiconductor memory device 110, the reverse injection of the electrons can be suppressed when applying the erasing bias to the connection portion connecting the two semiconductor pillars; and a nonvolatile semiconductor memory device having a three dimensionally stacked structure with good erasing characteristics can be provided.

As described above, by making the curvature of the outer insulating film 43 smaller than that of the inner insulating film 42 at the semiconductor pillar SP portion, the electric field EF of the outer insulating film 43 can be made lower than that of the inner insulating film 42 to suppress the reverse injection of the electrons Cg1 toward the outer insulating film 43 even in the case where a similar material is used in the inner insulating film 42 and the outer insulating film 43.

Conversely, when a tunneling current flows during writing/erasing operations in the case of a planar memory, the electric field applied to the blocking insulating film has substantially the same intensity as that applied to the tunneling insulating film in the case where materials having the same relative dielectric constant are used as the blocking insulating film and the tunneling insulating film. Therefore, problems occur, particularly when the erasing bias is applied, in which the threshold value cannot be reduced due to the reverse injection of electrons from the gate electrode. To solve such problems, the desired writing/erasing operations may be considered possible by using a material (e.g., aluminum oxide) as the blocking insulating film having a relative dielectric constant higher than that of the tunneling insulating film (e.g., silicon nitride); providing a difference between the electric field applied to the tunneling insulating film and the electric field applied to the blocking insulating film; and reducing the leak current of the blocking insulating film. However, using a material having a high relative dielectric constant reduces the compatibility of process integration and may result in unstable operations from deterioration of the data retention characteristics, etc., due to relaxation current due to the dielectric polarization unique to materials having high relative dielectric constants.

Conversely, as described above, in the nonvolatile semiconductor memory device 110 according to this embodiment, the inner insulating film 42 and the outer insulating film 43 are provided on the inner and outer side faces of the memory layer 48 having a pipe configuration; and an electric field difference can be generated due to the curvature difference. Therefore, constraints on the relative dielectric constant required by the outer insulating film 43 can be relaxed. In other words, the relative dielectric constant of the outer insulating film 43 can be equal to the relative dielectric constant of the inner insulating film 42. Also, the relative dielectric constant of the connection portion outer insulating film 44 can be equal to the relative dielectric constant of the inner insulating film 42. The compatibility of process integration can be high, for example, for the inner insulating film 42, the outer insulating film 43, and the connection portion outer insulating film 44; and a silicon oxide film (silicon oxide) having a high reliability can be used.

Thus, it is desirable for the inner insulating film 42 and the outer insulating film 43 to include silicon oxide. As described below, the connection portion outer insulating film 44 also may include silicon oxide.

An example of a method for manufacturing the nonvolatile semiconductor memory device 110 will now be described.

FIGS. 7A to 7G are schematic cross-sectional views in order of the processes, illustrating the method for manufacturing the nonvolatile semiconductor memory device according to the first embodiment.

Namely, FIGS. 7A to 7G are cross-sectional views of the connection portion CP when cut in the X-Z plane.

FIGS. 8A to 8D are schematic cross-sectional views in order of the processes, illustrating the method for manufacturing the nonvolatile semiconductor memory device according to the first embodiment.

Namely, FIGS. 8A to 8D are cross-sectional views of the semiconductor pillars SP and the connection portion CP when cut in the Y-Z plane.

Figure 7A:
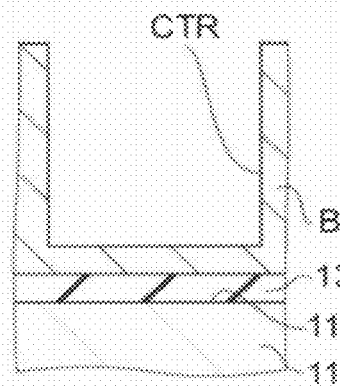
FIGS. 7A to 7G are schematic cross-sectional views in order of the processes, illustrating a method for manufacturing the nonvolatile semiconductor memory device according to the first embodiment.

As illustrated in FIG. 7A, a silicon oxide film forming the inter-layer insulating film 13 is deposited on the major surface 11a of the semiconductor substrate 11 made of silicon with, for example, a thickness of 100 nm (nanometers) by, for example, CVD (Chemical Vapor Deposition). Then, a conductive film BGf of, for example, 200 nm forming the back gate BG is deposited. The conductive film BGf may include, for example, As-doped amorphous silicon, P-doped amorphous silicon, etc. Subsequently, the trench CTR in which the connection portion CP is formed is made in the conductive film BGf using lithography and RIE (Reactive Ion Etching).

Figure 7B:
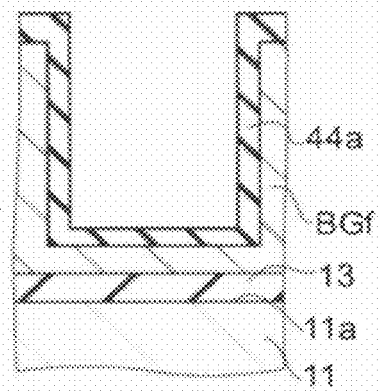

As illustrated in FIG. 7B, an insulating film 44a forming a portion of the connection portion outer insulating film 44 is formed on the inner wall face of the trench CTR. The insulating film 44a may include, for example, a silicon oxide film (silicon oxide). The thickness of the insulating film 44a may be, for example, 5 nm.

Figure 7C:
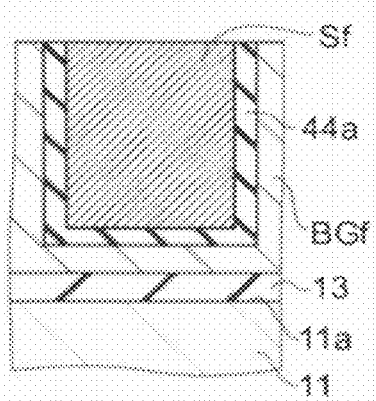

Continuing as illustrated in FIG. 7C, a sacrificial layer Sf made of, for example, a silicon nitride film (silicon nitride) is filled into the remaining space of the trench CTR. The insulating film 44a on the conductive film BGf is removed; and the sacrificial layer Sf on the conductive film BGf and the insulating film 44a is removed.

Figure 7D:
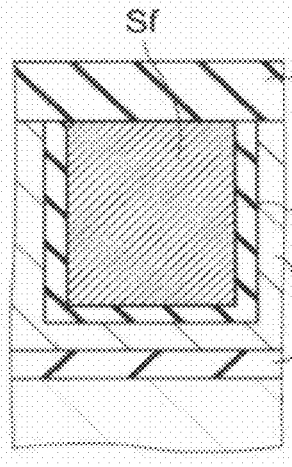

Then, as illustrated in FIG. 7D, an inter-layer insulating film 13b made of, for example, a silicon oxide film is formed on the conductive film BGf, the insulating film 44a, and the sacrificial layer Sf.

Figure 8A:
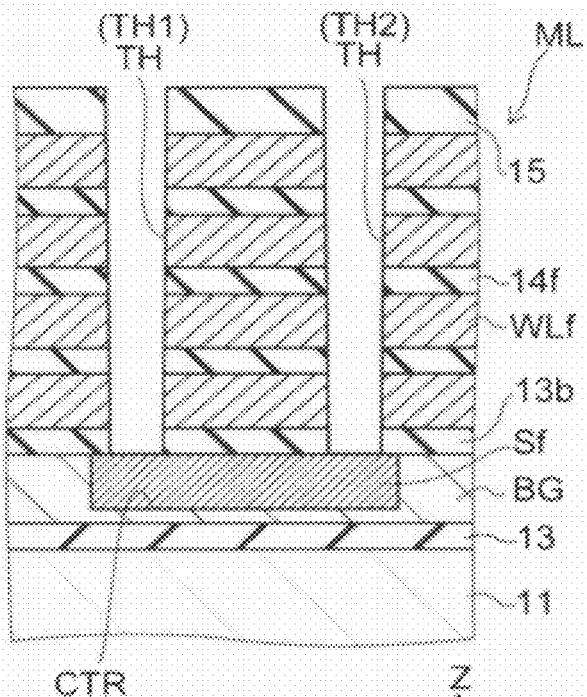
FIGS. 8A to 8D are schematic cross-sectional views in order of the processes, illustrating the method for manufacturing the nonvolatile semiconductor memory device according to the first embodiment.

Subsequently, as illustrated in FIG. 8A, an insulating film 14f forming the inter-electrode insulating film 14 is alternately deposited on the inter-layer insulating film 13b the desired number of repetitions with a conductive film WLf forming the electrode film WL; and the inter-layer insulating film 15 is deposited thereupon. The conductive film WLf may include, for example, As-doped amorphous silicon, P-doped amorphous silicon, etc. Thereby, the stacked structural unit ML is formed. Herein, the inter-layer insulating film 15 is taken to be included in the stacked structural unit ML.

Subsequently, the through-holes TH (a first through-hole TH1 and a second through-hole TH2) are made in the stacked structural unit ML by collective patterning using lithography and RIE. At this time, the through-hole TH is made to a depth reaching the sacrificial layer Sf filled into the trench CTR. Thereby, a portion of the sacrificial layer Sf is exposed.

The diameter of the through-hole TH is, for example, 60 nm. However, the invention is not limited thereto. The diameter of the through-hole TH is arbitrary.

The cross-sectional configuration of the through-hole TH is circular (including circular, elliptic, flattened circular shapes, etc.). Thereby, the curvature of the outer insulating film 43 is smaller than the curvature of the inner insulating film 42; and the electric field EF of the outer insulating film 43 can be lower than that of the inner insulating film 42.

Figure 8B:
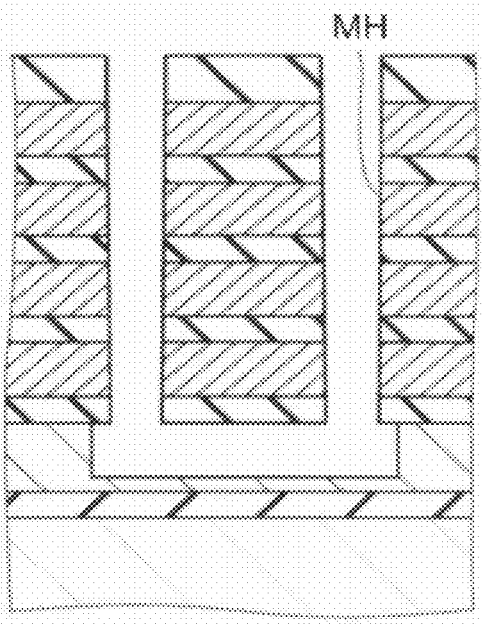

Subsequently, as illustrated in FIG. 8B, hot phosphoric acid ($H_3PO_4$) treatment, for example, is performed to remove the sacrificial layer Sf. Thereby, a memory hole MH is made having a U-shaped configuration of two of the through-holes TH connected by the trench CTR.

Figure 7E:
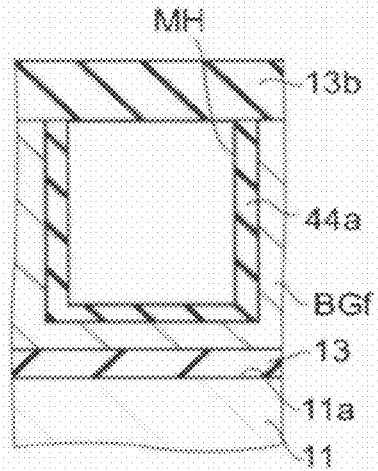

FIG. 7E illustrates the state around the connection portion CP for this process.

Figure 7F:
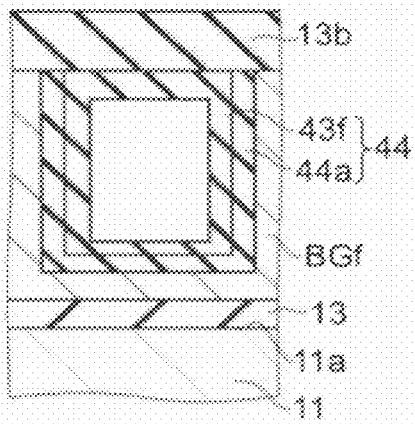

Then, as illustrated in FIG. 7F, an insulating film 43f forming the outer insulating film 43 is formed in the interior of the memory hole MH (the through-holes TH and the trench CTR). The insulating film 43f may include, for example, a silicon oxide film. The thickness of the insulating film 43f may be, for example, 10 nm.

In the trench CTR portion, the stacked film of the insulating film 44a and the insulating film 43f form the connection portion outer insulating film 44. The thickness of the connection portion outer insulating film 44 is 15 nm. On the other hand, the insulating film 43f forming the outer insulating film 43 is formed on the inner side face of the through-hole TH. The thickness of the outer insulating film 43 formed on the inner side face of the through-hole TH is 10 nm.

Figure 7G:
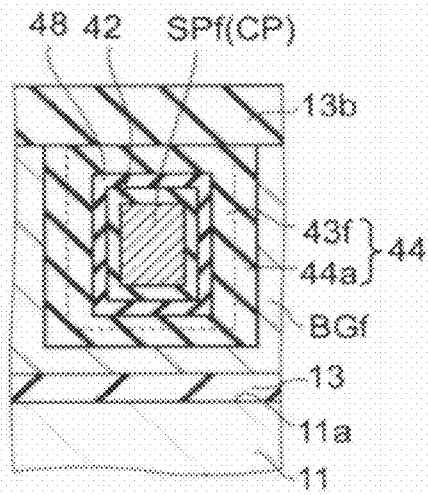

Subsequently, as illustrated in FIG. 7G, a silicon nitride film forming the memory layer 48 and having a thickness of 4 nm and a silicon oxide film forming the inner insulating film 42 and having a thickness of 5 nm are sequentially deposited into the remaining space of the memory hole MH. A non-doped amorphous silicon film SPf forming the semiconductor pillar SP (the channel) is filled into the remaining space.

Figure 8C:
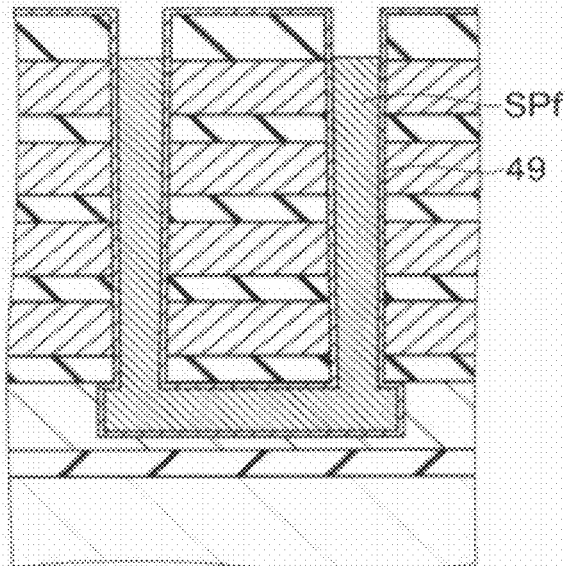

Then, as illustrated in FIG. 8C, etch-back of the amorphous silicon film SPf is performed to expose a stacked film 49 made of the inner insulating film 42, the memory layer 48, and the outer insulating film 43. Then, for example, dilute hydrofluoric acid treatment and hot phosphoric acid treatment are sequentially performed to remove the exposed stacked film 49.

Figure 8D:
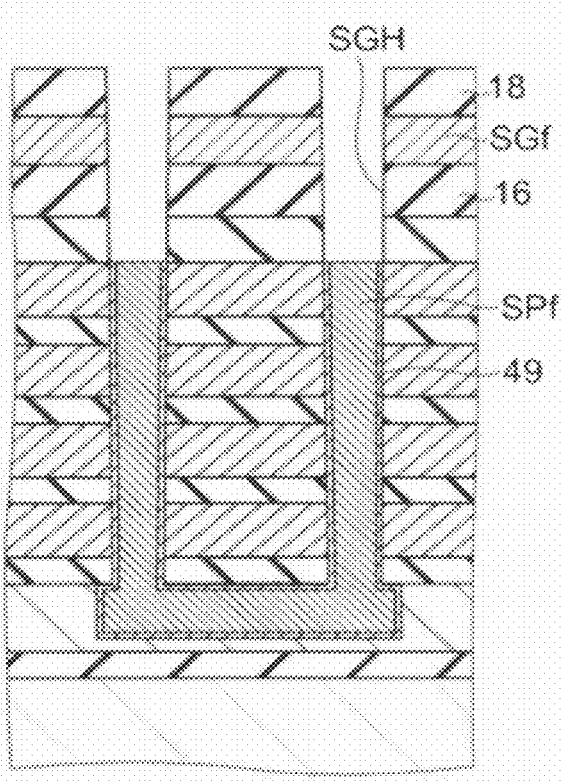

Subsequently, as illustrated in FIG. 8D, the inter-layer insulating film 16, an amorphous silicon film SGf forming the selection gate electrode SG, and the inter-layer insulating film 18 are sequentially deposited. Subsequently, a selection gate hole SGH is made in these films to reach the amorphous silicon film SPf in the memory hole MH.

Then, a silicon nitride film forming the selection gate insulating film SGI of the selection gate transistor is deposited onto the wall face of the inner side of the selection gate hole SGH. After removing the silicon nitride film on the bottom portion of the selection gate hole SGH by etching, amorphous silicon, for example, forming the channel of the selection gate transistor is deposited; and etch-back is performed to the desired depth.

Thereafter, after the prescribed formation of contacts and interconnect processes, the nonvolatile semiconductor memory device 110 illustrated in FIG. 1A to FIG. 5 is formed.

The thickness of the insulating film 44a, the insulating film 43f (the film forming the outer insulating film 43), the memory layer 48, and the inner insulating film 42 recited above are examples. The invention is not limited thereto.

Although the case is described above where a silicon nitride film (silicon nitride) is used as the memory layer 48, the invention is not limited thereto. The memory layer 48 may include a single-layer film or a stacked film, the single-layer film being one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

The inter-electrode insulating film 14, the inner insulating film 42, the outer insulating film 43, and the connection portion outer insulating film 44 may include a single-layer film or a stacked film, the single-layer film being one selected from the group consisting of silicon oxide, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

FIGS. 9A to 9C are schematic cross-sectional views illustrating the configurations of a main component of other nonvolatile semiconductor memory devices according to the first embodiment.

Namely, FIGS. 9A to 9C are cross-sectional views corresponding to the cross section along line B-B' of FIG. 1A.

In another nonvolatile semiconductor memory device 111 according to this embodiment, the portion of the trench CTR where the side face CTR1 and the bottom face CTR2 intersect is a curved surface as illustrated in FIG. 9A. Otherwise, the nonvolatile semiconductor memory device 111 is the same as the nonvolatile semiconductor memory device 110. In such a case as well, the side face CTR1 and the bottom face CTR2 of the trench CTR have planar portions; and in at least these portions, the thickness of the connection portion outer insulating film 44 is thicker than the outer insulating film 43 opposing the semiconductor pillar SP. In other words, the connection portion outer insulating film 44 is formed of the stacked film of the insulating film 44a provided on the wall face of the trench CTR and the insulating film 43f on the inner side thereof; and on the other hand, the outer insulating film 43 is formed of the insulating film 43f. Accordingly, in such a case as well, the connection portion outer insulating film 44 is thicker than the outer insulating film 43 by the amount of the thickness of the insulating film 44a.

In another nonvolatile semiconductor memory device 112 according to this embodiment, the side face CTR1 of the trench CTR is inclined with respect to the major surface 11a as illustrated in FIG. 9B. In such a case as well, the side face CTR1 and the bottom face CTR2 of the trench CTR have planar portions; and in at least at these portions, the thickness of the connection portion outer insulating film 44 is thicker than that of the outer insulating film 43. Thus, the planar portion of the wall face of the trench CTR may be a plane inclined with respect to the major surface 11a (i.e., a plane inclined with respect to the first direction).

In another nonvolatile semiconductor memory device 113 according to this embodiment, the side face CTR1 of the trench CTR has an inclination angle with respect to the major surface 11a even greater than that of the nonvolatile semiconductor memory device 112; and the width of the bottom face CTR2 is narrower than that of the nonvolatile semiconductor memory device 112 as illustrated in FIG. 9C. In other words, the cross-sectional configuration of the trench CTR is substantially a triangle. In such a case as well, the side face CTR1 of the trench CTR has a planar portion; and in at least at this portion, the thickness of the connection portion outer insulating film 44 is thicker than that of the outer insulating film 43.

Although the connection portion outer insulating film 44 is made thicker than the outer insulating film 43 in the description recited above by the connection portion outer insulating film 44 being formed of the stacked film of the insulating film 44a provided on the wall face of the trench CTR and the insulating film 43f on the inner side thereof, any method may be used to make the connection portion outer insulating film 44 thicker than the outer insulating film 43.

At least one selected from the insulating film 44a and the insulating film 43f recited above may be a stacked film made of multiple films; and the insulating film 44a and the insulating film 43f may include mutually different materials.

Second Embodiment

Figure 10:
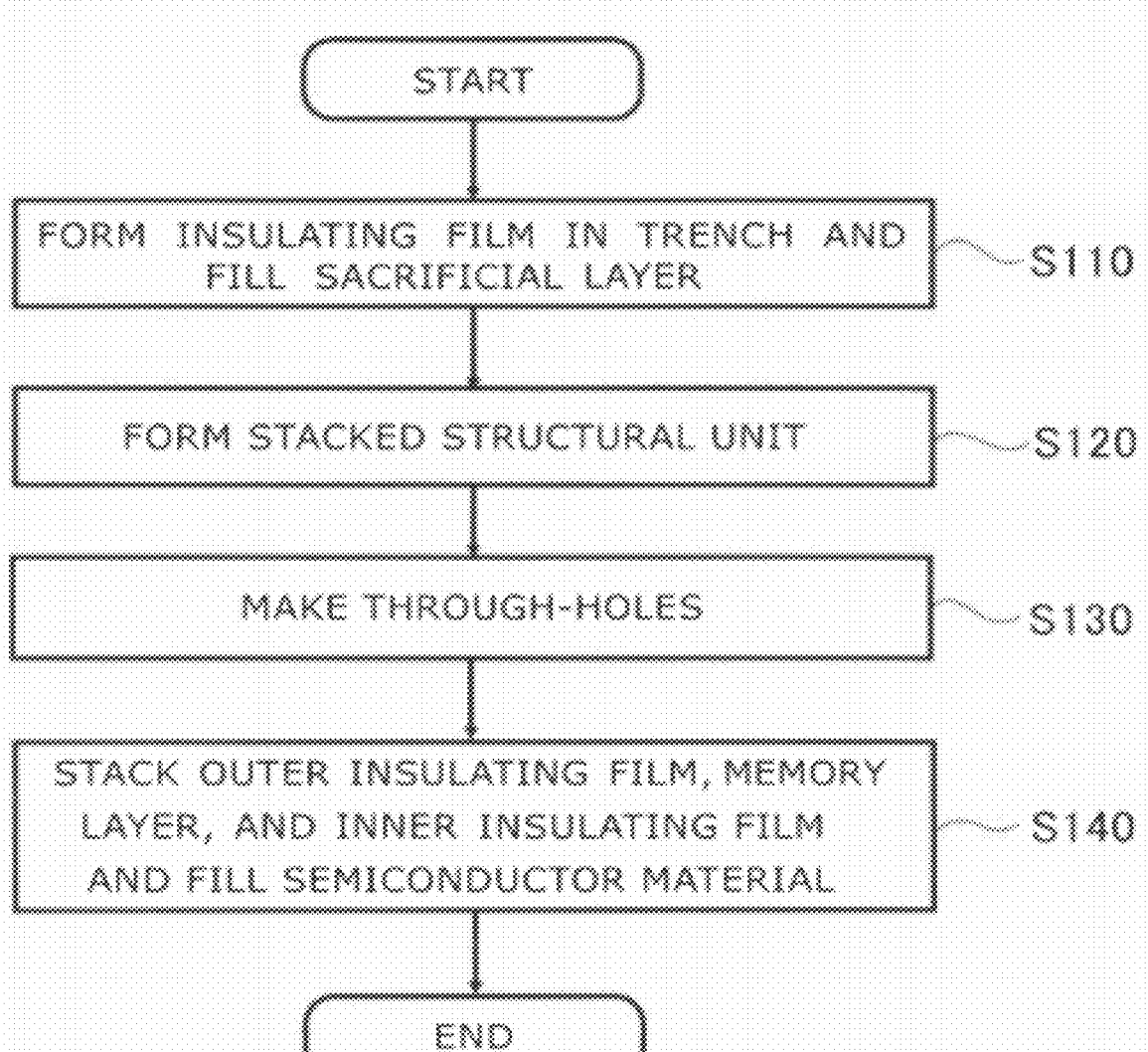
FIG. 10 is a flowchart illustrating a method for manufacturing a nonvolatile semiconductor memory device according to a second embodiment.

FIG. 10 is a flowchart illustrating a method for manufacturing a nonvolatile semiconductor memory device according to a second embodiment.

In the method for manufacturing the nonvolatile semiconductor memory device according to this embodiment, first, the trench CTR is made in a conductive layer (the conductive film BGf forming the back gate BG) provided on the major surface 11a of the semiconductor substrate 11 (the substrate); an insulating film (the insulating film 44a) is formed on the wall face of the trench CTR; and subsequently, the sacrificial layer Sf is filled into the remaining space of the trench CTR as illustrated in FIG. 10 (step S110).

In other words, the processing described in regard to FIGS. 7A to 7C is implemented.

Then, the multiple electrode films WL are alternately stacked with the multiple inter-electrode insulating films 14 on the conductive layer (the conductive film BGf), the insulating film (the insulating film 44a), and the sacrificial layer Sf recited above in the Z axis direction perpendicular to the major surface 11a to form the stacked structural unit ML (step S120).

In other words, the processing described in regard to FIG. 7D and FIG. 8A is implemented.

Then, the first through-hole TH1 and the second through-hole TH2 are made to pierce the stacked structural unit ML in the Z axis direction and reach the sacrificial layer Sf, where the first through-hole TH1 and the second through-hole TH2 are adjacent to each other in the Y axis direction (step S130).

In other words, the processing described in regard to FIG. 8A is implemented.

Then, the sacrificial layer Sf is removed via the first and second through-holes TH1 and TH2 to expose the insulating film (the insulating film 44a) recited above; and subsequently, the outer insulating film 43, the memory layer 48, and the inner insulating film 42 are stacked on the wall faces of the first through-hole TH1, the second through-hole TH2, and the exposed insulating film (the insulating film 44a); and a semiconductor material (e.g., the amorphous silicon film SPf) is filled into the remaining space of the first through-hole TH1, the second through-hole TH2, and the trench CTR (step S140).

In other words, the processing described in regard to, for example, FIGS. 8B and 8C is implemented.

Thereby, the nonvolatile semiconductor memory devices 110 to 113 described in regard to the first embodiment can be manufactured.

According to the method for manufacturing the nonvolatile semiconductor memory device according to this embodiment, the connection portion outer insulating film 44 can have a stacked film of the insulating film 44a provided on the wall face of the trench CTR and the insulating film 43f on the inner side thereof; and the connection portion outer insulating film 44 can be made thicker than the outer insulating film 43 opposing the semiconductor pillar SP by the amount of the thickness of the insulating film 44a. Thereby, the electric field EF of the connection portion outer insulating film 44 can be lower than that of the inner insulating film 42 at the connection portion CP; the reverse injection of the electrons can be suppressed when applying the erasing bias; and a nonvolatile semiconductor memory device having a three dimensionally stacked structure with good erasing characteristics can be manufactured.

In the method for manufacturing the nonvolatile semiconductor memory device according to this embodiment, it is sufficient for the depth and the width of the trench CTR to be deeper and wider than a trench of a manufacturing method of conventional art by the amount of the thickness of the insulating film 44a.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may appropriately select specific configurations of components of nonvolatile semiconductor memory devices such as semiconductor substrates, electrode films, insulating films, insulating layers, stacked structural units, charge storage layers, semiconductor pillars, word lines, bit lines, source lines, and the like from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile semiconductor memory devices and methods for manufacturing nonvolatile semiconductor memory devices practicable by an appropriate design modification by one skilled in the art based on the nonvolatile semiconductor memory devices and the methods for manufacturing nonvolatile semiconductor memory devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the embodiments described above are within the scope of the invention to the extent that the purport of the invention is included.

The invention claimed is:

1. A nonvolatile semiconductor memory device, comprising:
    a stacked structural unit including a plurality of electrode films alternately stacked in a first direction with a plurality of inter-electrode insulating films;
    a first semiconductor pillar piercing the stacked structural unit in the first direction;

a second semiconductor pillar adjacent to the first semiconductor pillar in a second direction perpendicular to the first direction, the second semiconductor pillar piercing the stacked structural unit in the first direction;

a connection portion semiconductor layer aligned in the second direction to electrically connect the first semiconductor pillar and the second semiconductor pillar on a same side in the first direction;

a connection portion conductive layer provided to oppose the connection portion semiconductor layer;

a memory layer provided between the first semiconductor pillar and each of the electrode films, between the second semiconductor pillar and each of the electrode films, and between the connection portion conductive layer and the connection portion semiconductor layer;

an inner insulating film provided between the memory layer and the first semiconductor pillar, between the memory layer and the second semiconductor pillar, and between the memory layer and the connection portion semiconductor layer;

an outer insulating film provided between the memory layer and each of the electrode films; and a connection portion outer insulating film provided between the memory layer and the connection portion conductive layer, the connection portion outer insulating film having a film thickness thicker than a film thickness of the outer insulating film.

2. The device according to claim 1, wherein a connection portion outer interface between the connection portion outer insulating film and the memory layer includes a planar portion.

3. The device according to claim 1, wherein at least a portion of the connection portion outer insulating film is filled into a trench made in the connection portion conductive layer and at least one selected from a side face and a bottom face of the trench has a planar portion.

4. The device according to claim 3, wherein the planar portion is inclined with respect to the first direction.

5. The device according to claim 1, wherein a relative dielectric constant of the connection portion outer insulating film is equal to a relative dielectric constant of the inner insulating film.

6. The device according to claim 1, wherein a material of the outer insulating film is substantially identical to a material of at least a portion of an inner portion of the connection portion outer insulating film.

7. The device according to claim 1, wherein the outer insulating film is collectively formed with at least a portion of the connection portion outer insulating film on a side of the connection portion.

8. The device according to claim 1, wherein a portion of the inner insulating film opposing the first and second semiconductor pillars is formed collectively with a portion of the inner insulating film opposing the connection portion semiconductor layer.

9. The device according to claim 1, wherein the inner insulating film, the outer insulating film, and the connection portion outer insulating film include silicon oxide.

10. The device according to claim 1, wherein a curvature of an interface between the inner insulating film and the memory layer when the inner insulating film is cut in a plane perpendicular to the first direction is greater than a curvature of an interface between the outer insulating film and the memory layer when the outer insulating film is cut in the plane perpendicular to the first direction.

11. The device according to claim 1, wherein a cross section of the first semiconductor pillar and a cross section of the second semiconductor pillar cut in a plane perpendicular to the first direction have a circular shape or a flattened circular shape.

12. The device according to claim 1, wherein the inner insulating film, the memory layer, and the outer insulating film have a concentric circular annular cylindrical configuration centered on the first semiconductor pillar and the second semiconductor pillar.

13. The device according to claim 1, wherein the memory layer includes a single-layer film or a stacked film, the single-layer film being one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

14. The device according to claim 1, wherein a material of the first semiconductor pillar and the second semiconductor pillar is substantially identical to a material of the connection portion semiconductor layer.

15. The device according to claim 1, wherein at least one selected from the connection portion semiconductor layer and the electrode film includes amorphous silicon having an added impurity or polysilicon having an added impurity.

* * * * *